United States Patent
Dietrich et al.

(10) Patent No.: US 11,754,643 B2
(45) Date of Patent: Sep. 12, 2023

(54) METHOD AND APPARATUS FOR SETTING A GAIN AT AN INSTALLED MAGNETIC FIELD SENSOR

(71) Applicant: Schaeffler Technologies AG & Co. KG, Herzogenaurach (DE)

(72) Inventors: Markus Dietrich, Oberkirch (DE); Didier Zaegel, Illkirch (FR); Jörg Merkle, Bühlertal (DE)

(73) Assignee: Schaeffner Technologies AG & Co. KG, Herzogenaurach (DE)

( * ) Notice: Subject to any disclaimer, the term of this patent is extended or adjusted under 35 U.S.C. 154(b) by 403 days.

(21) Appl. No.: 17/046,605

(22) PCT Filed: Apr. 15, 2019

(86) PCT No.: PCT/DE2019/100341
§ 371 (c)(1),
(2) Date: Oct. 9, 2020

(87) PCT Pub. No.: WO2019/206368
PCT Pub. Date: Oct. 31, 2019

(65) Prior Publication Data
US 2021/0123987 A1  Apr. 29, 2021

(30) Foreign Application Priority Data
Apr. 26, 2018  (DE) .......................... 102018110075.2

(51) Int. Cl.
G01R 33/02 (2006.01)
G01D 5/14 (2006.01)
G01R 33/00 (2006.01)

(52) U.S. Cl.
CPC ............. *G01R 33/02* (2013.01); *G01D 5/145* (2013.01); *G01R 33/007* (2013.01)

(58) Field of Classification Search
CPC ....... G01R 33/02; G01R 33/007; G01D 5/145
See application file for complete search history.

(56) References Cited

U.S. PATENT DOCUMENTS

| | | | |
|---|---|---|---|
| 6,032,109 A | 2/2000 | Ritmiller | |
| 6,927,566 B2* | 8/2005 | Apel ...................... | G01D 5/145 324/207.21 |
| 7,173,414 B2* | 2/2007 | Ricks ................... | G01D 5/2449 324/207.25 |
| 11,187,763 B2* | 11/2021 | Schmitt .................... | G01D 5/16 |
| 2003/0141862 A1 | 7/2003 | Vig et al. | |

(Continued)

FOREIGN PATENT DOCUMENTS

| DE | 3852829 T2 | 7/1995 |
|---|---|---|
| DE | 20008931 U1 | 8/2001 |

(Continued)

*Primary Examiner* — Reena Aurora

(57) ABSTRACT

A method for setting a gain of a magnetic field sensor includes providing the magnetic field sensor and an evaluation unit on a same printed circuit board, generating a magnetic field signal with the magnetic field sensor, transmitting the magnetic field signal to the evaluation unit, evaluating the magnetic field signal with the evaluation unit, and transmitting a signal for setting the gain from the evaluation unit to the magnetic field sensor. In an example embodiment, the magnetic field sensor is a rotor position sensor of an electric motor.

13 Claims, 2 Drawing Sheets

(56) References Cited

U.S. PATENT DOCUMENTS

2009/0072816 A1  3/2009 Schrubbe et al.
2017/0131366 A1* 5/2017 Motz ..................... G01R 33/07

FOREIGN PATENT DOCUMENTS

| DE | 10333244 A1 | 2/2005 |
| DE | 102013205905 A1 | 10/2013 |
| DE | 102013208986 A1 | 12/2013 |
| DE | 102013213948 A1 | 2/2014 |
| DE | 102013211041 A1 | 12/2014 |
| DE | 102016120182 A1 | 5/2017 |
| GB | 2517152 A | 2/2015 |

* cited by examiner

METHOD AND APPARATUS FOR SETTING A GAIN AT AN INSTALLED MAGNETIC FIELD SENSOR

CROSS-REFERENCE TO RELATED APPLICATIONS

This application is the United States National Phase of PCT Appln. No. PCT/DE2019/100341 filed Apr. 15, 2019, which claims priority to German Application No. DE102018110075.2 filed Apr. 26, 2018, the entire disclosures of which are incorporated by reference herein.

TECHNICAL FIELD

The disclosure relates to a method for setting a gain at an installed magnetic field sensor, in particular a rotor position sensor of an electric motor, in which a magnetic field signal from the magnetic field sensor is tapped off and evaluated by an evaluation unit, and an apparatus for setting a gain at a magnetic field sensor for operating an actuator.

BACKGROUND

A method and an apparatus for determining a position of an electric motor are known from DE 10 2013 211 041 A1, in which a position signal from a rotor of the electric motor is tapped off by a magnetic field sensor system and is evaluated by an evaluation unit with regard to the position of the electric motor.

Clutch actuation systems are known in which control electronics are integrated in an actuator actuating the clutch. The evaluation unit, which is provided for evaluating the rotor position and for controlling or commutating an electric motor, is mounted on a printed circuit board. The sensor system for detecting the rotor position is constructed by means of a magnet on the rotor and a magnetic field-sensitive sensor. The construction of the actuator creates mechanical (static) tolerances between the magnet and the magnetic field-sensitive sensor chip. In addition, there are dynamic tolerances due to forces during operation of the actuator. To determine the gain of the output signal from the magnetic field-sensitive sensor, both tolerances must be maintained statically and dynamically. A fixed gain value is preprogrammed and stored in the evaluation unit in the form of a slope value.

In addition, it is known that the magnetic field-sensitive sensor is designed with a digital communication interface, wherein a small microprocessor is integrated into the sensor and communicating with a microprocessor of the evaluation unit via a digital interface. By means of this embodiment, the gain of the magnetic field signal from the magnetic field sensitive sensor can be varied within one operation of the actuator, but two microcontrollers are needed, which causes higher costs and is disadvantageous for the functional safety of the system.

In an alternative, a sensor with an analog interface can be used, but all tolerances of all possible embodiments of actuators must be taken into account for the calculation of the slope for the gain setting. Therefore, the gain cannot be reliably preset for each actuator. Too large of a slope for an actuator with a very small air gap can saturate the sensor. Too small of a slope can cause a very poor signal-to-noise ratio in the case of a weak useful signal.

SUMMARY

The disclosure specifies a method and an apparatus for setting a gain at an installed magnetic field sensor, in which at least the static tolerances of an actuator system between the magnet and the magnetic field sensor can be corrected.

According to the disclosure, after evaluating the magnetic field signal from the magnetic field sensor, the evaluation unit positioned on a printed circuit board emits a signal for setting a gain to the magnetic field sensor positioned on the same printed circuit board. This has the advantage that different gains can be set at any time and thus changing static tolerances between the magnet and the magnetic field sensor can be corrected by an adapted gain setting, although the magnetic field sensor and evaluation unit are installed on a common printed circuit board. This adaptation is advantageous since the gain in the sensor signal is adapted even if the evaluation unit cannot provide a programming voltage.

The signal for setting a gain is coarse-adjusted in a first step and fine-adjusted in a second step. A coarse adjustment can thus be carried out when the actuator is started up, since the value of the magnetic field signal from the magnetic field sensor is known approximately. The second step can be adjusted over the life of the sensor to correct a decrease in the magnetic field of the magnet spanning the magnetic field to be sensed over a certain period of time.

In one design, a maximum magnetic field signal is determined in a first step at a minimum distance of the magnetic field sensor from an element generating a magnetic field and at a predetermined temperature. An ideal gain is determined therefrom, which does not exceed a predetermined measuring range.

In one embodiment, the first step is carried out after the magnetic field sensor has been installed in an actuator system for the first time. This provides a starting point for the setting of the actuator system for controlling a clutch actuator system, for example.

In one variant, the second step is carried out in a resting state of the actuator system during operation of the actuator in a drive system. In such a resting situation, in which no force is exerted on the mechanical parts of the actuator system, for example, the gain can be easily adapted to form a maximum magnetic field signal.

In a simple embodiment, a current magnetic field signal from the magnetic field sensor is measured by the evaluation unit in the resting state of the actuator system and compared with the maximum magnetic field signal, and the signal for setting the gain is set as a function of the comparison.

In a further variant, when a rotor of the electric motor carrying a permanent magnet rotates, a sine component and a cosine component of the magnetic field signal from the magnetic field sensor are evaluated by the evaluation unit. A first signal for setting the gain of the sine component and a second signal for setting the gain of the cosine component are output to the magnetic field sensor via one channel each. The gain at the magnetic field sensor can thus also be set when the magnetic field sensor is not arranged parallel to the axis of rotation of the electric motor. In this case, the gain components are not of the same size, but can be set to the maximum of each of the individual components in the magnetic field sensor.

One development of the disclosure relates to an apparatus for setting a gain at a magnetic field sensor for operating an actuator. The actuator is operable by an electric motor and includes a magnetic field sensor designed as a rotor position sensor for determining a position of a rotor of the electric motor. The magnetic field sensor is connected to an evaluation unit for determining the position of the rotor of the electric motor from a magnetic field signal from the magnetic field sensor.

In an apparatus in which a gain of a magnetic field sensor which has already been installed in the actuator can be set, the magnetic field sensor and the evaluation unit determining a signal for gain setting on the basis of the magnetic field signal output by the magnetic field sensor is positioned in the actuator on a common printed circuit board. The signal for setting a gain can be transmitted from the evaluation unit to the magnetic field sensor via an electrical connection channel between the evaluation unit and an unused connection of the magnetic field sensor.

In an inexpensive apparatus, the evaluation unit evaluating a sine component and a cosine component of the magnetic field signal is connected via a first electrical connection channel to a first unused connection of the magnetic field sensor for transmitting the first signal for setting the gain of the sine component of the magnetic field signal, and is connected via a second electrical connection channel with a second unused connection of the magnetic field sensor for transmitting the second signal for setting the gain of the cosine component of the magnetic field signal. Since the gain values for the sine or cosine component are known in the evaluation unit, a simple presetting is possible, and these gain components can be taken into account in the angle calculation of the rotor from the two components.

In one embodiment, the magnetic field sensor has an analog interface for connection to the evaluation unit. An analog signal can thus be easily transmitted from the evaluation unit to an unused connection of the magnetic field sensor.

BRIEF DESCRIPTION OF THE DRAWINGS

The disclosure allows for numerous embodiments. One of these will be explained in more detail with reference to the figures shown in the drawings, wherein.

DETAILED DESCRIPTION

Figure 1:
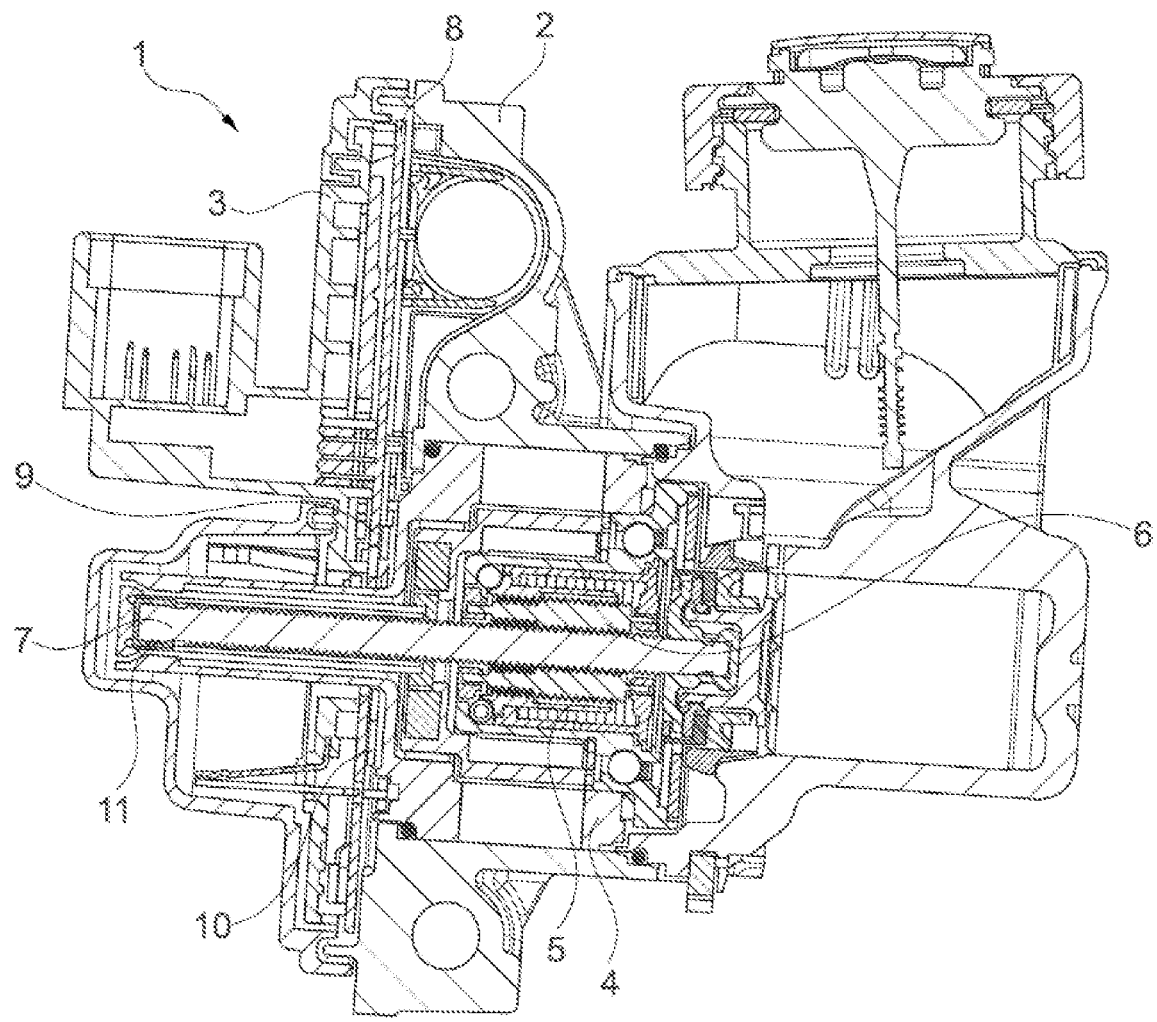
FIG. 1 shows an exemplary embodiment of the apparatus according to the disclosure.

FIG. 1 shows an exemplary embodiment of the apparatus according to the disclosure, as is used, for example, as a clutch actuator in a clutch actuation system of a vehicle. The clutch actuator 1 includes a housing 2, which is closed with a housing cover 3. An electric motor 4 is arranged within the housing 2, and drives a planetary roller gear 5. The planetary rolling elements 6 of the planetary roller gear 5 engage in a threaded spindle 7, converting the rotary movement of the electric motor 4 into an axial movement of the threaded spindle 7. A printed circuit board 8 is designed to be perpendicular to the threaded spindle 7. A magnetic field sensor 9 and an evaluation unit 10 for the magnetic field signal, which is output by the magnetic field sensor 9, are arranged on the printed circuit board 8. The magnetic field sensor 9 is operatively connected to a magnet 11, which is attached radially to a tip of the threaded spindle 7 that faces away from the planetary roller gear 5.

In the given case, such an actuator is considered in which both the magnetic field sensor 9 and the evaluation unit 10 are installed on the same printed circuit board 8, and the printed circuit board 8 is installed before the magnetic field sensor 9 is started up. To correct static tolerances between the magnetic field sensor 9 and the magnet 11, a gain of the magnetic field signal emitted by the magnetic field sensor 9 is corrected using the evaluation unit 10 in the installed state.

Figure 2:
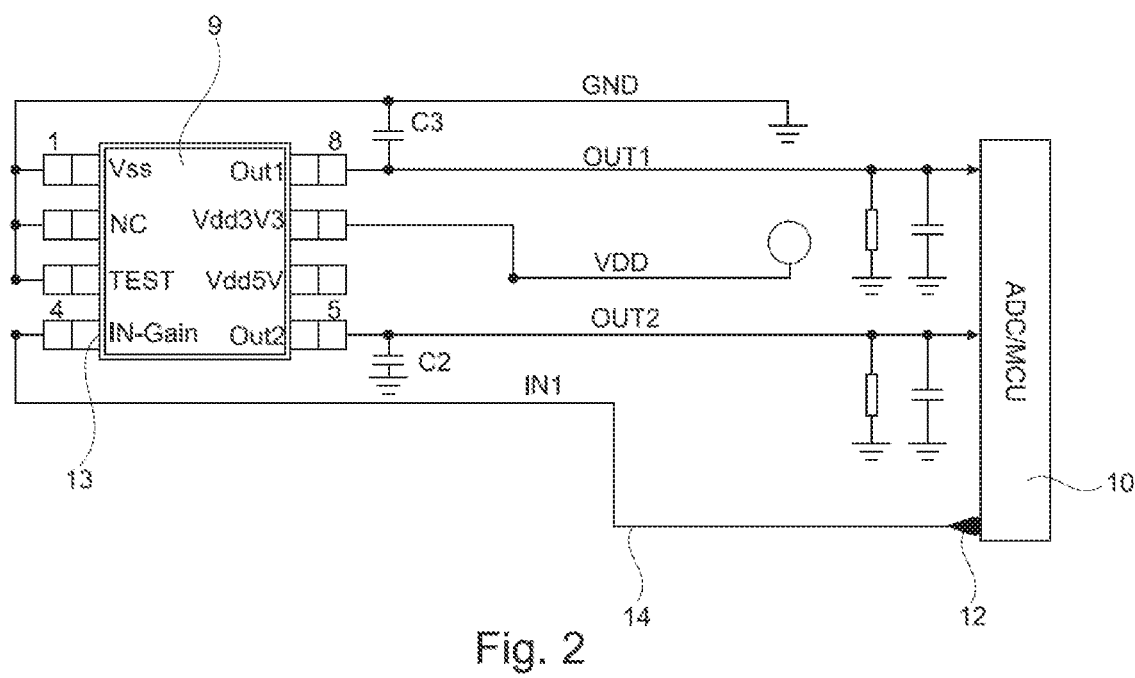
FIG. 2 shows an exemplary embodiment of the method according to the disclosure.

For this purpose, as shown in FIG. 2, a connection 14 is established between an analog output 12 of the evaluation unit 10 and an uncontacted input 13 of the magnetic field sensor 9, via which a signal for setting the gain is supplied to the magnetic field sensor 9.

The first gain setting takes place during the start-up process of the actuator. The rotor moves the threaded spindle 7 and a corresponding magnetic field signal is sent to the evaluation unit 10 at the output $U_{out1}$ of the magnetic field sensor 9. This magnetic field signal corresponds approximately to a maximum magnetic field signal, which is stored as a threshold value in the evaluation unit 10. The evaluation unit 10 determines an ideal gain by means of a threshold value comparison. This ideal gain is recorded in the new state of the magnetic field sensor 9 at approximately 25°, wherein a minimum distance between the gear spindle 7 and the magnet 11 is required. This gain setting is stored in the evaluation unit 10 and passed on to the magnetic field sensor 9 via the analog output 12.

If the actuator 1 has started operation, a magnetic field decrease can occur over the life of the magnet 11, which is compensated for by adapting the gain of the magnetic field signal from the magnetic field sensor 9. This gain determination is carried out in a rest situation of the actuator 1, in which no mechanical forces act on the threaded spindle 7. Here too, the magnetic field signal emitted by the magnetic field sensor 9 is evaluated by the evaluation unit 10 and compared with the maximum magnetic field signal stored during start-up. From the difference between these two signals, a signal for setting a gain is determined, which is forwarded via the analog output 12 to the analog sensor input 13 of the magnetic field sensor 9, wherein the magnetic field sensor 9 amplifies the magnetic field signal accordingly.

If the sensor system is not arranged in the axis of rotation of the threaded spindle 7, the gain has two gain factors, which are not of the same size. The sine component and the cosine component of the magnetic field signal are evaluated separately from the evaluation unit 10 and compared individually with a predetermined gain. The gain values for the cosine signal and the sine signal are transmitted to the magnetic field sensor 9 on different gain channels (not shown further), wherein each gain channel is input to an input 13 of the magnetic field sensor 9 that is no longer used. Thus, in the case of an installed magnetic field sensor 9, even if a programming voltage is not provided by the evaluation unit 10, the gain of the magnetic field signal from the magnetic field sensor 9 can be varied accordingly, which enables a reliable position determination of the threaded spindle 7 of the actuator 1.

REFERENCE NUMERALS

1 Clutch actuator
2 Housing
3 Housing cover
4 Electric motor
5 Planetary roller gear
6 Planetary rolling element
7 Threaded spindle
8 Printed circuit board
9 Magnetic field sensor
10 Evaluation unit
11 Magnet
12 Analog output from the evaluation unit
13 Uncontacted input from the magnetic field sensor
14 Connection

The invention claimed is:

1. A method for setting a gain of a magnetic field sensor, comprising:
   providing the magnetic field sensor and an evaluation unit on a same printed circuit board;
   generating a magnetic field signal with the magnetic field sensor;
   transmitting the magnetic field signal to the evaluation unit;
   evaluating the magnetic field signal with the evaluation unit by comparing the magnetic field signal with a threshold magnetic field signal, wherein the threshold magnetic field signal is determined at a minimum distance of the magnetic field sensor from an element generating a magnetic field and at a predetermined temperature;
   setting the gain based on a difference between the magnetic field signal and the threshold magnetic field signal; and
   transmitting a signal for setting the gain from the evaluation unit to the magnetic field sensor.

2. The method of claim 1 wherein the magnetic field sensor is a rotor position sensor of an electric motor.

3. The method of claim 2, wherein, during rotation of a rotor of the electric motor carrying a permanent magnet, the method further comprises:
   evaluating a sine component and a cosine component of the magnetic field signal from the magnetic field sensor with the evaluation unit; and
   outputting a first signal for setting the gain of the sine component and a second signal for setting the gain of the cosine component to the magnetic field sensor via two separate channels.

4. The method of claim 3, wherein the magnetic field sensor includes a first unused connection and a second unused connection, the first signal being output via a first electrical channel between the evaluation unit and the first unused connection, and the second signal being output via a second electrical channel between the evaluation unit and the second unused connection.

5. The method of claim 1, further comprising:
   coarse adjusting the signal for setting the gain in a first step; and
   fine adjusting the signal for setting the gain in a second step.

6. The method of claim 5 wherein the first step comprises determining the threshold magnetic field signal.

7. The method of claim 6, further comprising installing the magnetic field sensor in an actuation system prior to the first step.

8. The method of claim 7, wherein the second step is carried out during a resting state of the actuator system during operation of the actuator system in a drive system.

9. The method of claim 8, wherein the gain is set during the resting state of the actuator system.

10. The method of claim 1, wherein the magnetic field sensor includes an unused connection, the signal for setting the gain being transmitted via an electrical channel between the evaluation unit and the unused connection.

11. An actuator operable by an electric motor, comprising:
    a common printed circuit board;
    a magnetic field sensor:
       positioned in the actuator on the common printed circuit board;
       designed as a rotor position sensor for determining a position of a rotor of the electric motor;
       connected to an evaluation unit for determining the position of the rotor of the electric motor from a magnetic field signal from the magnetic field sensor; and
       comprising an unused connection; and
    the evaluation unit:
       positioned in the actuator on the common printed circuit board; and
       arranged to determine a gain setting signal based on the magnetic field signal; and
       arranged to transmit the gain setting signal to the magnetic field sensor via an electrical connection channel between the evaluation unit and the unused connection.

12. The actuator of claim 11, wherein:
    the magnetic field signal comprises a sine component and a cosine component;
    the unused connection comprises a first unused connection and a second unused connection;
    the electrical connection channel comprises a first electrical connection channel and a second electrical connection channel;
    the evaluation unit is arranged to:
       evaluate the magnetic field signal to determine the sine component and the cosine component;
       determine a first signal for setting a sine component gain using the sine component and a second signal for setting a cosine component gain using the cosine component;
       transmit the first signal to the first unused connection via the first electrical connection channel; and
       transmit the second signal to the second unused connection via the second electrical connection channel.

13. The actuator of claim 11, wherein the magnetic field sensor comprises an analog interface for connection to the evaluation unit.

* * * * *